United States Patent [19]
Ryder

[11] 3,976,896
[45] Aug. 24, 1976

[54] REFERENCE VOLTAGE SOURCES

[75] Inventor: Alan Ryder, Church Crookham, near Aldershot, England

[73] Assignee: The Solartron Electronic Group Limited, Farnborough, England

[22] Filed: Oct. 28, 1975

[21] Appl. No.: 626,143

[30] Foreign Application Priority Data
Oct. 29, 1974    United Kingdom............... 46868/74

[52] U.S. Cl.............................. 307/297; 307/229; 307/254; 330/30 D
[51] Int. Cl.²......................................... H03K 1/12
[58] Field of Search ........... 307/297, 296, 254, 229, 307/230; 330/30 D

[56]     References Cited
         UNITED STATES PATENTS
3,890,558   6/1975   Guisinger et al.................... 307/297

Primary Examiner—Stanley D. Miller, Jr.
Assistant Examiner—B. P. Davis
Attorney, Agent, or Firm—William R. Sherman; Stewart F. Moore; Kevin McMahon

[57]     ABSTRACT

A bipolar reference voltage source comprises first and second ratio-matched transistors having respective collector load resistors and arranged to pass slightly different currents. The emitter of the first transistor is connected to two emitter resistors in series, while the emitter of the second is connected to the junction between the emitter resistors. The bases of the transistors are commoned, while their collectors are respectively connected to the two inputs of a differential amplifier. A switching arrangement has a first state in which the output of the differential amplifier is connected to the bases of the transistors, and the end of the two emitter resistors remote from the transistors is grounded, thereby producing a first reference voltage of one polarity at the output of the differential amplifier. The switching arrangement has a second state in which the output of the differential amplifier is connected to the end of the two emitter resistors remote from the transistors, the bases of the transistors are grounded and the polarity of the gain of the differential amplifier is reversed, thereby producing a second reference voltage, equal in magnitude but opposite in polarity to the first, at the output of the differential amplifier.

9 Claims, 3 Drawing Figures

REFERENCE VOLTAGE SOURCES

This invention relates to reference voltage sources, and is more particularly but not exclusively concerned with reference voltage sources for use in analogue-to-digital converters.

Analogue-to-digital converters, e.g. of the dual- or triple-ramp type, normally include a bipolar reference voltage source, viz a positive reference voltage source for use in converting analogue input signals of one polarity (usually negative) and a negative reference voltage source for use in converting analogue input signals of the other polarity. Conventionally, this bipolar reference voltage source is implemented with discrete components, for example one or more highly stable zener diodes for generating the positive reference voltage and a unity-gain inverting amplifier for deriving the negative reference voltage from the positive reference voltage. This has the disadvantage that the inverting amplifier may introduce errors into the negative reference voltage, e.g. temperature-dependent errors due to drift or offsets in the amplifier, which errors are not present in the positive reference voltage, so that the conversion factor of the analogue-to-digital converter is not the same for positive and negative analogue input signals. Further, since many analogue-to-digital converters are currently at least partly implemented as one or more large scale integrated circuits, a bipolar reference source made from discrete components undesirably increases the number of connections required by the associated integrated circuit, and prevents the full benefit of reduced manufacturing costs normally achieved by the use of integrated circuits from being realised.

It is therefore an object of the present invention to provide a bipolar reference voltage source which, when used in an analogue-to-digital converter, alleviates the aforementioned problem of different conversion factors for analogue input signals of different polarity, and which is suitable for implementation as, or in, an integrated circuit.

According to the present invention, there is provided a bipolar reference voltage source comprising:

a pair of ratio-matched transistors arranged to pass respective currents having different predetermined current densities at the respective emitters of the transistors, the emitter of one of the transistors being connected to two emitter resistances in series and the emitter of the other transistor being connected to the junction between the emitter resistances;

first and second power supply lines, the collectors of the transistors being coupled to said first power supply line by respective load means;

high-gain differential amplifier means having first and second inputs connected to respective ones of the collectors of the transistors, and an output connected to adjust the currents passed by the transistors to maintain the respective voltages at their collectors substantially equal; and switching means having a first state in which the output of the differential amplifier means is coupled to the bases of the transistors, and the second power supply line is coupled to the end of the two emitter resistances remote from the emitter of said one transistor, so as to produce a first reference voltage of one polarity between the output of the differential amplifier means and the second power supply line, the switching means having a second state in which the output of the differential amplifier means is coupled to said end of the two emitter resistances, the second power supply line is coupled to the bases of the transistors and the polarity of the gain of the differential amplifier means is changed, so as to produce a second reference voltage, equal in magnitude but opposite in polarity to the first reference voltage, between the output of the differential amplifier means and the second power supply line. Thus the same circuit components are used for generating the first and second reference voltages, the only difference lying in the way the components are connected together by the switching means: the effect of this difference can readily be made negligible, so that the respective magnitudes of the two reference voltages track each other very closely. Additionally, the circuit components are all suitable for integrated circuit implementation.

In one embodiment of the invention, the two transistors are substantially identical, and said one transistor is arranged to pass a smaller current than the other. In this case, each load means may comprise a respective collector resistance, the collector resistance of said one transistor being greater in value than that of the other transistor.

In an alternative and preferred embodiment of the invention, the transistors are arranged to pass substantially equal currents, the emitter of said one transistor being greater in area that the emitter of the other. In this case, each load means may comprise a respective collector resistance, the two collector resistances being substantially equal in value.

The switching means may change the polarity of the gain of the differential amplifier means by interchanging the connections of the first and second inputs to the respective collectors of the transistors as the switching means changes from its first stage to its second state. Alternatively and preferably, the differential amplifier means may include an amplifying stage switchable between inverting and non-inverting states in response to the switching means.

Conveniently, the transistors are NPN transistors, the first power supply line being positive with respect to the second, and the inverting input of the differential amplifier means being connected to the collector of said one transistor in the first state of the switching means, whereby the first reference voltage is positive.

An embodiment of the invention will now be described, by way of example only, with reference to the accompanying drawings, of which:

Figure 1:
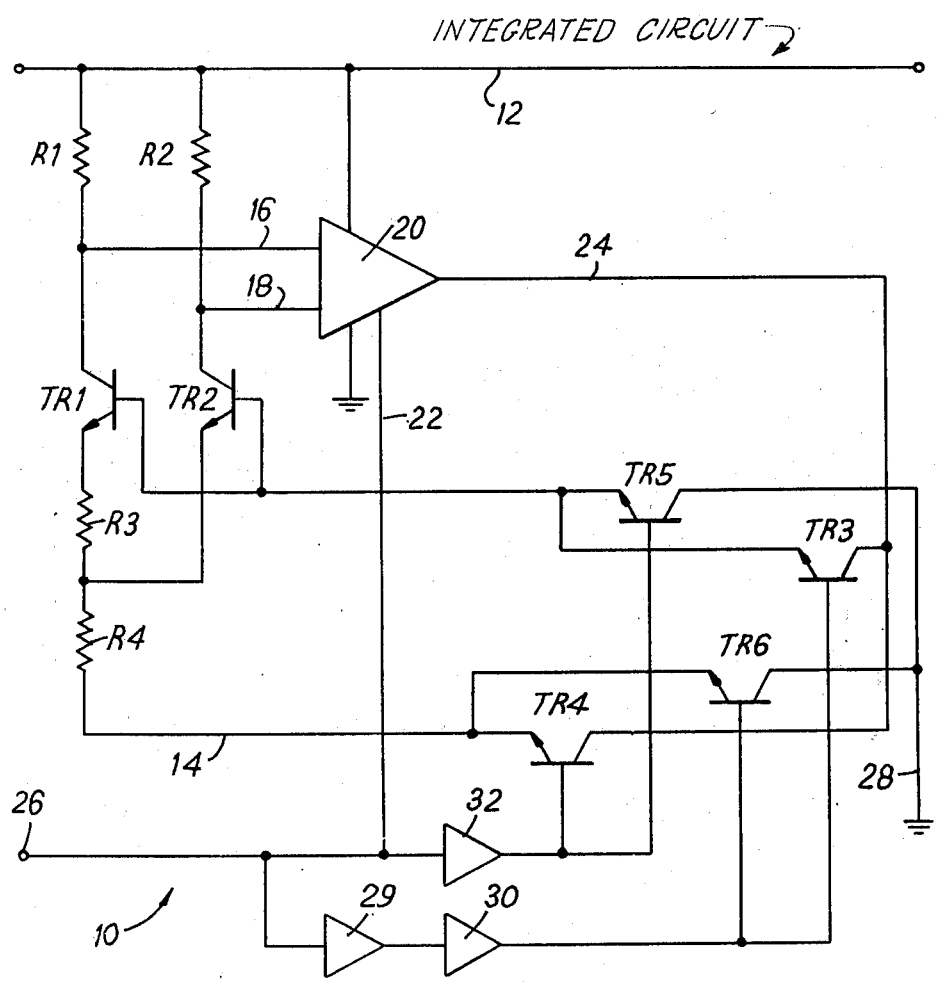
FIG. 1 is a circuit diagram of an integrated circuit bipolar reference voltage source in accordance with the present invention.

The reference voltage source shown in FIG. 1 is indicated generally at 10, and comprises a pair of ratio-matched NPN transistors TR1, TR2 which are substantially identical to one another except that the emitter of the transistor TR1 is greater in area, typically by a factor of ten, than the emitter of the transistor TR2. The collectors of the transistors, TR1, TR2 are connected via respective collector resistors R1, R2, which are substantially equal in value, to a positive power supply line 12, while their bases are commoned. The emitter of the transistor TR1 is connected via two emitter resistors R3, R4 in series to a line 14, while the emitter of the transistor TR2 is connected to the junction of the resistors R3 and R4.

The respective collectors of the transistors TR1 and TR2 are connected to first and second inputs 16, 18 of a high gain differential amplifier 20. The amplifier 20 has a control input 22, whereby the polarity of its gain can be changed as will hereinafter be described, and an output 24. The control input 22 of the amplifier 20 is connected to a polarity change input 26 of the source 10.

The output 24 of the amplifier 20 is connected via a first transistor switch TR3 to the commoned bases of the transistors TR1, TR2, and via a second transistor switch TR4 to the line 14. The commoned bases of the transistors TR1, TR2 are connected via a third transistor switch TR5 to a zero volt power supply line 28, which is connected to the line 14 via a fourth transistor switch TR6. The transistor switches TR3 to TR6 are all NPN transistors. The input 26 is connected to the bases of the transistor switches TR3 and TR6 via an inverter 29 and a switch driving amplifier 30, and to the bases of the transistor switches TR4 and TR5 via a switch driving amplifier 32. The amplifiers 30, 32 merely provide the correct voltage levels for operating the transistor switches TR3 to TR6, the arrangement being such that a zero voltage control signal applied to the input 26 renders the switches TR3, TR6 conductive and the switches TR4, TR5 non-conductive, while a positive voltage control signal applied to the input 26 renders the switches TR3, TR6 non-conductive and the switches TR4, TR5 conductive.

Figure 2:
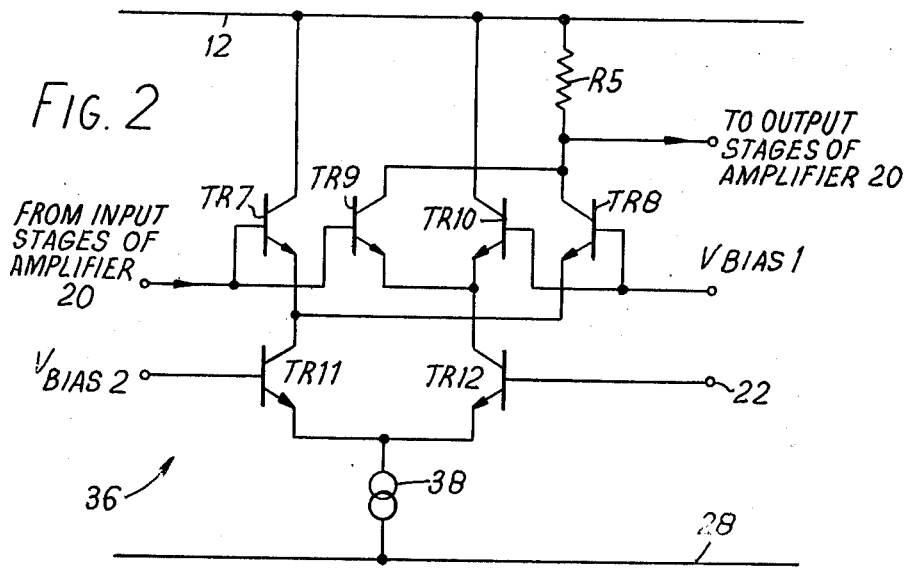
FIG. 2 is a more detailed circuit diagram of part of the circuit of FIG. 1.

FIG. 2 shows at 36 a gain polarity change circuit or gain-inverting circuit forming part of the amplifier 20 of FIG. 1. The circuit 36 comprises first and second emitter-coupled pairs of matched NPN transistors TR7, TR8 and TR9, TR10. The collectors of the transistors TR7, TR10 are connected to the line 12, while the collectors of the transistors TR8, TR9 are commoned and connected to the line 12 via a common collector resistor R5.

The bases of the transistors TR7, TR9 are commoned and connected to the output of the input stage of the amplifier 30, which input stage is not shown in FIG. 2 but may typically comprise yet another emitter-coupled pair of NPN transistors. The bases of the transistors TR8, TR10 are also commoned, and connected to receive a suitable bias voltage. The commoned collectors of the transistors TR8, TR10 constitute the output of the circuit 36, and are connected to the output stages (not shown) of the amplifier 20. Thus the two emitter-coupled pairs TR7, TR8 and TR9, TR10 are effectively connected in parallel, and it will be appreciated that the gain of the emitter coupled pair TR7, TR8 is positive, while the gain of the emitter-coupled pair TR9, TR10 is negative, the two gains being substantially equal in magnitude.

A third emitter-coupled pair of NPN transistors TR11, TR12 is arranged with the collector of the transistor TR11 connected to the commoned emitters of the transistors TR7, TR8 and with the collector of the transistor TR12 connected to the commoned emitters of the transistors TR9, TR10. The commoned emitters of the transistors TR11, TR12 are connected to the line 28 via a transistor arranged to operate as a constant current source, as shown symbolically at 38. The base of the transistor TR11 is connected to receive another suitable bias voltage, while the base of the transistor TR12 constitutes the control input 22 of the amplifier 20.

Thus, when the aforementioned zero voltage control signal is applied to the input 26, the transistor TR12 is rendered non-conductive and the transistor TR11 is rendered conductive, thereby rendering the emitter-coupled pair TR9, TR10 inoperative and the emitter-coupled pair TR7, TR8 operative. However, when the aforementioned positive control signal is applied to the input 26, the transistor 12 is rendered conductive and the transistor TR11 is rendered non-conductive, thereby rendering the emitter-coupled pair TR9, TR10 operative and emitter-coupled pair TR7, TR8 inoperative. The circuit 36 is therefore operative to change the polarity of the gain of the amplifier 20 in response to the control voltage at the input 26.

The whole of the circuitry of the source 10 described hereinbefore with reference to FIGS. 1 and 2 is implemented as an integrated circuit on a common substrate, which may of course form part of a much larger substrate of a substantially complete integrated circuit analogue-to-digital converter.

In operation, and assuming that a zero voltage control voltage is appllied to the input 26, the transistor switches TR3, TR6 are conductive and the transistor switches TR4, TR5 are nonconductive. Further, the emitter-coupled pair TR7, TR8 in the amplifier 20 is operative while the emitter-coupled pair TR9, TR10 is inoperative: the amplifier 20 is designed so that under these conditions, the inputs 16 and 18 constitute an inverting input and a non-inverting input respectively.

The transistors TR1 and TR2 pass respective collector currents $I_1$ and $I_2$. The source 10 stabilizes with a constant positive voltage $V_{out}$ between the output 24 of the amplifier 20 and the power supply line 28, since any tendency of $V_{out}$ to increase tends to cause the current $I_2$ to increase more than the current $I_1$, which applies a net negative input to the amplifier 20 so as to oppose the increase in $V_{out}$, and conversely, any tendency of $V_{out}$ to decrease tends to cause the current $I_2$ to decrease more than the current $I_1$, thus applying a net positive input to the amplifier 20 so as to oppose the decrease in $V_{out}$. In this stable state, the amplifier 30 maintains the collector voltages of the transistors TR1, TR2, and therefore the currents $I_1$ and $I_2$, substantially equal, so that the current density $J_1$ at the emitter of the transistor TR1 is less than the current density $J_2$ at the emitter of the transistor TR2.

The voltage $V_{out}$ is given by $$V_{out} = V_{BE2} + (I_1 + I_2) R4 = V_{BE2} + \frac{mkT}{q} \ln \frac{J_2}{J_1} \cdot \frac{R4}{R3} \cdot \frac{(I_1 + I_2)}{I_1}, \quad (1)$$

which simplifies to $$V_{out} = B_{BE2} + 2 \frac{mkT}{q} \ln \frac{J_2}{J_1} \cdot \frac{R4}{R3}, \quad (2)$$

where $V_{BE2}$ is the base-emitter voltage of the transistor TR2, $k$ is Boltzmann's constant, $q$ is the electron charge constant, $T$ is the absolute temperature, and $m$ is a junction scaling factor for the transistor TR1. The first term on the right hand side of equation (2) has a negative temperature coefficient, while the second term has a positive temperature coefficient. The respective values of the currents $I_1$, $I_2$, current densities $J_1$, $J_2$ and resistors R3, R4 are therefore chosen to make the temperature coefficients of these terms substantially equal in magnitude over a temperature range centred on the normal operating temperature, e.g. room temperature, of the source 10. Under these conditions, the voltage $V_{out}$ has a substantially zero temperature coefficient in the region of its normal operating temperature, and is therefore ideally suited for use as a reference voltage.

In order to change the polarity of the reference voltage $V_{out}$, the aforementioned positive control voltage is applied to the input 26, thereby rendering the transistor switches TR3, TR6 non-conductive and rendering the transistor switches TR4, TR5 conductive: additionally, the emitter-coupled pair TR7, TR8 in the amplifier 20 is rendered inoperative, while the emitter-coupled pair TR9, TR10 is rendered operative, which effectively interchanges the functions of the inputs 16, 18, i.e. the input 16 becomes the non-inverting input and the input 18 becomes the inverting input. The amplifier 30 still operates to maintain the collector voltages of the transistors TR1, TR2, and therefore the currents $I_1$ and $I_2$, substantially equal in a manner analogous to that already described, but the voltage $V_{out}$ is now given by $$V_{out} = -[V_{BE2} + (I_1 + I_2) R4] \quad (3)$$

Thus the reference voltage $V_{out}$ is changed to a new voltage equal in magnitude but opposite in polarity to that originally produced (and defined by equation (1)). A typical value for the reference voltage $V_{out}$ is about 3 volts, although other values are possible.

Figure 3:
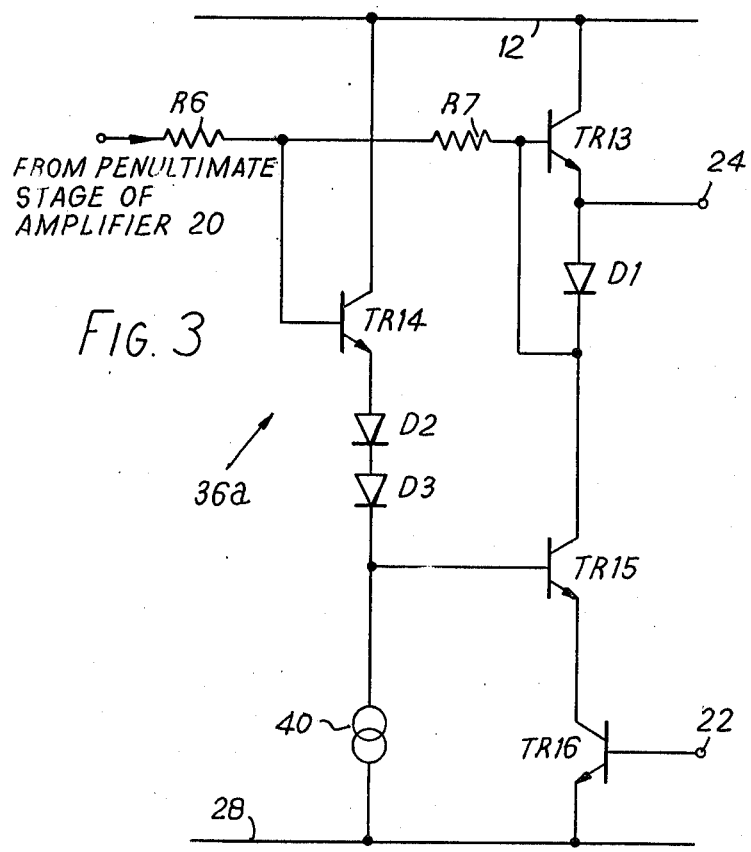
FIG. 3 is a more detailed circuit diagram of part of an alternative embodiment of the circuit of FIG. 1, also in accordance with the present invention.

Several modifications can be made to the reference voltage source 10 hereinafter described. For example, the circuit 36 can be replaced by a gain polarity change circuit connected as the output stage of the amplifier 30. Such a circuit is shown at 36a in FIG. 3, and comprises two resistors R6, R7 connected in series between the output of the penultimate stage of the amplifier 30 and the base of an NPN transistor TR 13 connected as an emitter follower: the penultimate stage of the amplifier 30 is not shown in FIG. 3, but may be constituted by an emitter-coupled pair of transistors. The junction between the resistors R6, R7 is connected to the base of another NPN transistor TR14, also connected as an emitter follower. The emitter of the transistor TR13 constitutes the output 24 of the amplifier 30, and is connected via a diode D1 to the collector of an NPN transistor TR15, which collector is also connected to the base of the transistor TR13. The emitter of the transistor TR14 is connected via a plurality of forward-biased diodes, two of which are shown at D2, D3, to the base of the transistor TR15, the diodes D2, D3 serving merely to provide an appropriate voltage level shift between the emitter of the transistor TR14 and the base of the transistor TR15. The base of the transistor TR15 is also connected, via a constant current source 40, to the supply rail 28, while its emitter is connecte via an NPN transistor switch TR16 to the rail 28.

In operation, when the transistor switch TR16 is non-conductive, substantially no current flows in the transistor TR15 and this transistor is effectively inoperative. The transistor TR13 therefore operates as a simple emitter-follower having a positive voltage gain of about unity for input voltages received from the penultimate stage of the amplifier 30. However, when the transistor switch TR16 is rendered conductive, the transistor TR15 conducts current and operates as an inverting stage for voltages applied to its base by the emitter follower transistor TR14. The transistors TR14, TR15 in effect constitute an inverting amplifier whose gain for input voltages received from the penultimate stage of the amplifier 30 is negative and determined by the resistor R6 (serving as an input resistance) and the resistor R7 (serving as a negative feedback resistance): the values of the resistors R6, R7 are chosen to make this negative gain also about unity.

As an alternative to the use of the circuits 36 or 36a, these circuits can be replaced by transistor switches similar to the switches TR3 to TR6 arranged to interchange the connections of the respective collectors of the transistors TR1, TR2 and the inputs 16, 18 of the amplifier 20. Further, the transistors TR1, TR2 can be substantially identical and the difference in the current densities at their respective emitters can be achieved by making the current $I_1$ smaller than the current $I_2$, e.g. by making the value of the resistor R1 greater than that of the resistor R2. Finally, the source 10 can be implemented using PNP transistors instead of NPN transistors, and could obviously be implemented with some discrete circuit components if desired.

What is claimed is:

1. A bipolar reference voltage source comprising:
    a pair of ratio-matched transistors arranged to pass respective currents having different predetermined current densities at the respective emitters of the transistors, the emitter of one of the transistors being connected to two emitter resistances in series and the emitter of the other transistor being connected to the junction between the emitter resistances;
    first and second power supply lines, the collectors of the transistors being coupled to said first power supply line by respective load means;
    high-gain differential amplifier means having first and second inputs connected to respective ones of the collectors of the transistors, and an output connected to adjust the currents passed by the transistors to maintain the respective voltages at their collectors substantially equal; and
    switching means having a first state in which the output of the differential amplifier means is coupled to the bases of the transistors, and the second power supply line is coupled to the end of the two emitter resistances remote from the emitter of said one transistor so as to produce a first reference voltage of one polarity between the output of the differential amplifier means and the second power supply line, the switching means having a second state in which the output of the differential amplifier means is coupled to said end of the two emitter resistances, the second power supply line is coupled to the bases of the transistors and the polarity of the gain of the differential amplifier means is changed, so as to produce a second reference voltage, equal in magnitude but opposite in polarity to the first reference voltage, between the output of the differential amplifier means and the second power supply line.

2. A reference voltage source as claimed in claim 1, wherein the two transistors are substantially identical, and said one transistor is arranged to pass a smaller current than the other.

3. A reference voltage source as claimed in claim 2, wherein each load means comprises a respective collector resistance, the collector resistance of said one transistor being greater in value than that of the other transistor.

4. A reference voltage source as claimed in claim 1, wherein the transistors are arranged to pass substantially equal currents, the emitter of said one transistor being greater in area than the emitter of the other.

5. A reference voltage source as claimed in claim 4, wherein each load means comprises a respective collector resistance, the two collector resistances being substantially equal in value.

6. A reference voltage source as claimed in claim 1, wherein the switching means is arranged to change the polarity of the gain of the differential amplifier means by interchanging the connections of the first and second inputs to the respective collectors of the transistors as the switching means changes from its first state to its second state.

7. A reference voltage source as claimed in claim 1, where the differential amplifier means includes an amplifying stage switchable between inverting and non-inverting states in response to the switching means.

8. A reference voltage source as claimed in claim 1, wherein the transistors are NPN transistors, the first power supply line being positive with respect to the second, and the inverting input of the differential amplifier means being connected to the collector of said one transistor in the first state of the switching means, whereby the first reference voltage is positive.

9. A reference voltage source as claimed in claim 1, said source being implemented as a single integrated circuit.

* * * * *